US009123860B2

(12) United States Patent
Cheung et al.

(10) Patent No.: US 9,123,860 B2
(45) Date of Patent: Sep. 1, 2015

(54) VACUUM REFLOW VOIDING REWORK SYSTEM

(75) Inventors: Dason Cheung, San Jose, CA (US); Murad Kurwa, San Jose, CA (US); Richard Loi, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 13/564,568

(22) Filed: Aug. 1, 2012

(65) Prior Publication Data

US 2014/0034715 A1 Feb. 6, 2014

(51) Int. Cl.
*B23K 31/02* (2006.01)
*H01L 31/18* (2006.01)
*B23K 3/04* (2006.01)
*B23K 1/018* (2006.01)
*B23K 1/008* (2006.01)
*B23K 1/00* (2006.01)
*B23K 3/08* (2006.01)

(52) U.S. Cl.
CPC .............. *H01L 31/188* (2013.01); *B23K 1/008* (2013.01); *B23K 1/0016* (2013.01); *B23K 1/018* (2013.01); *B23K 3/04* (2013.01); *B23K 3/087* (2013.01); *Y02E 10/50* (2013.01)

(58) Field of Classification Search
CPC .... B23K 2201/40; B23K 1/018; B23K 1/008; B23K 2201/42; B23K 1/0016; B23K 3/04; B23K 3/00; B23K 3/087
USPC ....................................... 228/178–180.22, 37
See application file for complete search history.

(56) References Cited

U.S. PATENT DOCUMENTS

| 5,409,543 | A | * | 4/1995 | Panitz et al. ....................... 134/2 |
| 5,598,965 | A | * | 2/1997 | Scheu ............................. 228/6.2 |
| 5,770,835 | A | | 6/1998 | Sakuyama et al. |
| 6,110,322 | A | * | 8/2000 | Teoh et al. ............... 156/345.52 |
| 6,152,353 | A | | 11/2000 | Sani Bakhtiari et al. |
| 6,360,940 | B1 | * | 3/2002 | Bolde et al. .................... 228/264 |
| 6,840,743 | B2 | | 1/2005 | Herke et al. |
| 2002/0084308 | A1 | | 7/2002 | Imai et al. |
| 2002/0134422 | A1 | * | 9/2002 | Bauman et al. ............... 136/244 |

(Continued)

FOREIGN PATENT DOCUMENTS

| EP | 1098354 A2 | 9/2001 |
| JP | 2010245309 A | 10/2010 |

OTHER PUBLICATIONS www.dictionary.com; cowling.*

(Continued)

*Primary Examiner* — Erin Saad
(74) *Attorney, Agent, or Firm* — Haverstock & Owens LLP (57) ABSTRACT

A solar cell module comprises a solar cell soldered to a mounting element, such as a ceramic substrate. The solder bond can comprise a void. A method of reducing a solder void comprises reflowing the solder using a vacuum source and a heat source in a sealed chamber. The chamber is formed, at least in part, by a cowling into which the solar cell module is mounted. A system for reducing voids in a solder bond comprises a heat source and a vacuum source coupled to the sealed chamber into which a solar cell module is placed. The system can optionally include a control system that automates the execution of methods of reducing solder voids. The system can further include a pressure source to aid in reducing the solder void and reflowing the solder after the void is reduced.

18 Claims, 9 Drawing Sheets

(56) References Cited

U.S. PATENT DOCUMENTS

| | | | |
|---|---|---|---|
| 2003/0000936 A1* | 1/2003 | Kim et al. | 219/390 |
| 2006/0006210 A1 | 1/2006 | Nonomura et al. | |
| 2006/0008759 A1* | 1/2006 | Shiozawa | 432/121 |
| 2006/0273141 A1* | 12/2006 | Saito et al. | 228/234.1 |
| 2009/0308430 A1 | 12/2009 | Everett et al. | |
| 2011/0296677 A1* | 12/2011 | Chen | 29/762 |
| 2012/0012645 A1 | 1/2012 | Motomura et al. | |
| 2012/0273559 A1* | 11/2012 | Patterson et al. | 228/221 |

OTHER PUBLICATIONS www.freedictionary.com; lid.*

Office action mail date: Jun. 4, 2013, U.S. Appl. No. 13/564,568, filed Aug. 1, 2012, Dason Cheung et al., 9 pages.

* cited by examiner

Section A-A

VACUUM REFLOW VOIDING REWORK SYSTEM

FIELD OF THE INVENTION

The present invention relates to the field of reworking of photovoltaic cells to reduce solder voids. More specifically, the present invention relates to systems and methods for reworking photovoltaic cells using vacuum reflow to reduce voids in photovoltaic cells.

BACKGROUND OF THE INVENTION

A solar cell module comprises a solar cell die soldered to a substrate. A known defect in the manufacturing of solar cell modules is the presence of voids in the solder between the solar cell die and the substrate. Voids in the solder can introduce at least two problems in a solar cell module. First, the solder contact area between the solar cell die and the substrate is reduced by the sum total of all void areas in the solder. The reduction in contact area increases the current density present in the solder that electrically couples the solar cell die to the substrate. Second, in concentrated photovoltaic (CPV) systems, light is focused onto a solar cell die to maximize solar energy conversion. In CPV systems, the concentration of light also concentrates substantial heat onto the solar cell die, through the die to the solder, from the solder to the substrate, and to an underlying sheet metal plane. A solder void comprises an atmosphere that reduces the thermal heat transfer area and increases the junction temperature. The increased junction temperature requires the use of heat sinks to keep the solar cell cool, otherwise the operating efficiency of the solar cell will drop significantly. The reduction in contact area further exacerbates the heating due to increased current density and can result in solar cell module failure.

To address these problems, it is preferable to control the area of any single solder void to less than 1% of the total solder area between the solar cell die and the substrate. It is further preferable to control the total area of voids to less than 5% of the total solder area between the solar cell die and the substrate.

SUMMARY OF THE INVENTION

To reduce the presence of solder voids in a solar cell module, between a solar cell die and substrate to which the die is soldered, the solar cell module can be reworked in a vacuum chamber. The reworking comprises applying heat to melt some or all of the solder encompassing a solder void, inside of a sealed chamber to which a vacuum is applied. The sealed chamber is preferably formed, at least in part, by one of the substrate and a cowling into which the solar cell module is mounted. The vacuum pulls out air in the void, termed degassing, thereby collapsing the void by raffling the solder into the void area. Vacuum reflow voiding rework systems and methods can also be applied to other types of electronic components that are similarly soldered to a substrate, particularly components that are subject to high heat build-up due to current density, such as a land grid array (L.A.) integrated circuit surface mount package and a quad-flat no-leads (QF) integrated circuit surface mount package. The systems and methods can also be utilized for non-electronic components where reduction or elimination of voids in a solder joint is needed.

In a first aspect, a method of reducing solder voids in a module comprises heating solder to a predetermined temperature and applying a vacuum to a sealed chamber. The module comprises a component soldered to a substrate that is mounted in a cowling and coupled to a heat source, the module is coupled to a vacuum source, and the method is practiced in a sealed chamber formed at least in part by the cowling. In a preferred embodiment, the predetermined temperature is a melting point of the solder. The heat source is able to be heated to a temperature before coupling the heat source to the substrate. The method preferably further comprises lowering a vacuum cover down onto the cowling, thereby forming the sealed chamber from the cowling, the vacuum cover, and the substrate. In some embodiments, heating the solder comprises heating an area of the solder that substantially encompasses a void in the solder. In other embodiments, heating the solder comprises heating substantially all of the solder. Heating substantially all of the solder is able to be performed after applying the vacuum to the chamber. In some embodiments, the vacuum pressure is modulated. In still other embodiments, the method further comprises applying a pressure to one of the component and the substrate such that solder is under a compressive force.

In a second aspect, a computer-readable medium is programmed with processor-executable instructions implementing any of the above methods of reducing solder voids in a module comprising a component soldered to a substrate. The computer-readable medium can comprise a processor programmed with executable instructions. In some embodiments, the computer-readable medium comprises a programmable logic array.

In a third aspect, a system for reducing solder voids in a module comprises a sealed chamber comprising the module and a vacuum cover, a heat source coupled to the sealed chamber, and a vacuum source coupled to the sealed chamber. A module comprises a component soldered to a substrate and mounted in a cowling. In a preferred embodiment, the heat source is retractable from the sealed chamber. In such embodiments, the heat source is able to be preheated before coupling the heat source to the sealed chamber. The heat source is configured to apply heat to one of the substrate and the solder such that at least a portion of the solder is melted. In some embodiments, the heat source comprises a plurality of heat modules. In such embodiments, the plurality of heat modules are individually controllable. The vacuum source can be configured to produce a modulated vacuum within the chamber. In a preferred embodiment, the vacuum source is adjustable. In a preferred embodiment, the system further comprises a heat sensor array configured to detect a temperature of at least a portion of one the component, the substrate, and the solder. Preferably, the system further comprises a control system operatively coupled to the heat source and the vacuum source, the control system comprising a processor and a memory configured to control the heat source, the vacuum source. In some embodiments, the control system can be configured to control retraction of the heat source.

Throughout the disclosure, reference is made to a solar module comprising a solar cell die soldered to a substrate. One skilled in the art will recognize that the disclosure applies generally to a component soldered to substrate having a solder void, such as a diode array soldered to a substrate.

DETAILED DESCRIPTION OF THE DRAWINGS

In the detailed description of the drawings that follows, the embodiments described are intended to illustrate features of the presently-claimed invention. Similar labels refer to similar or identical elements.

Figure 1A:
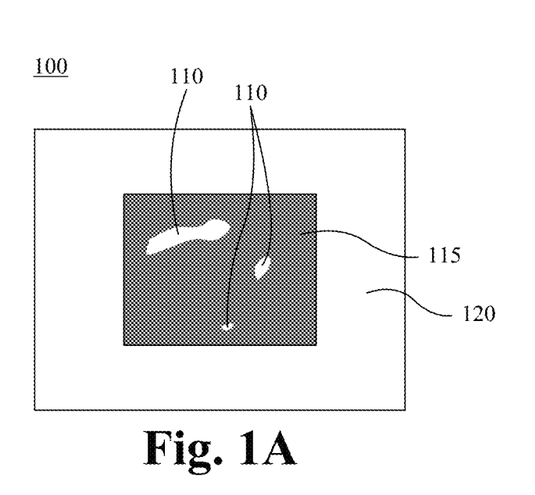
FIG. 1A illustrates a solar cell module having a solder void as is known in the art.
Figure 1B:
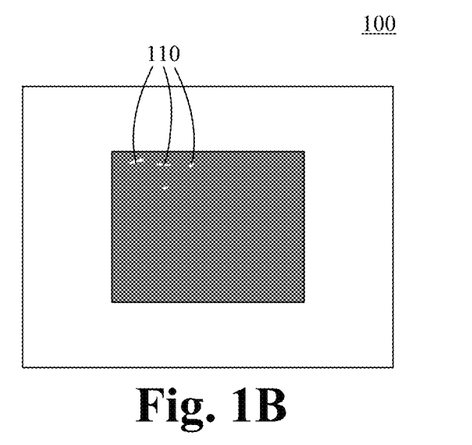
FIG. 1B illustrates a solar cell module after reworking by an embodiment of the presently-claimed invention.

FIG. 1A illustrates a solar cell module 100 having one or more solder voids 110 as is known in the art. The solar cell module 100 comprises a solar cell die (not shown) soldered 115 to a substrate 120. FIG. 1B illustrates the solar cell module 100 after reworking in accordance with an embodiment of the presently-claimed invention. In FIG. 1B, the solder voids 110 are substantially reduced or eliminated.

Figure 2A:
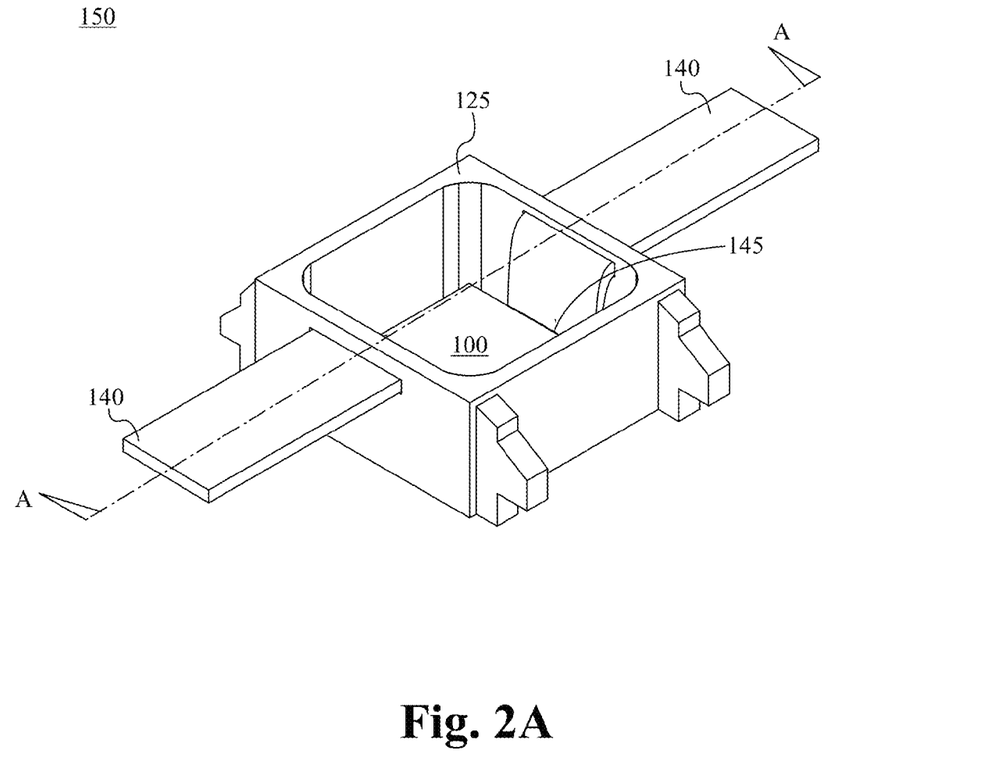
FIG. 2A illustrates a solar cell module installed in a cowling according to some embodiments.

FIG. 2A illustrates a mounted solar cell module 150 comprising a solar cell module 100 installed in a cowling 125 according to some embodiments. A conductor 140 enters the cowling 125 from each of two opposing sides. Each conductor 140 is soldered 145 to a contact on the solar cell module 100. Systems and methods of soldering the conductor 140 to the contact on the solar cell module 100 are disclosed in co-pending U.S. patent application Ser. No. 13/564,542, entitled "Hot Bar Soldering", filed on Aug. 1, 2012, by inventors Dason Cheung, Richard Loi, and Mario Lopez, which is hereby incorporated by reference in its entirety for all purposes.

Figure 2B:
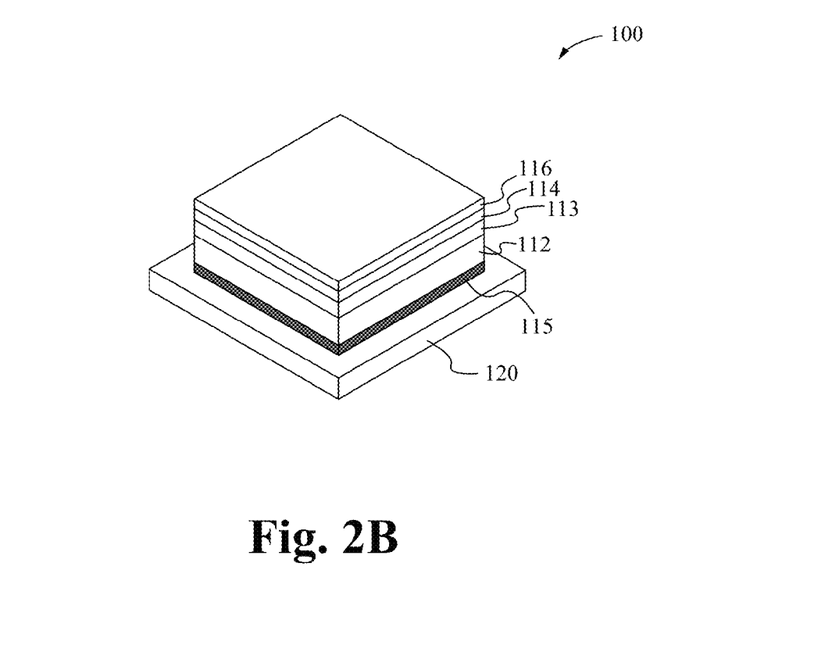
FIG. 2B illustrates a solar cell module as is known in the art.

FIG. 2B illustrates an example solar cell module 100 as is known in the art. A typical solar cell module 100 comprises a solar cell die 105 soldered 115 to a substrate 120. The solar cell die 105 further comprises a P-layer 112, an N-layer 113, a front grid 114, and an anti-reflective coating 116.

Figure 2C:
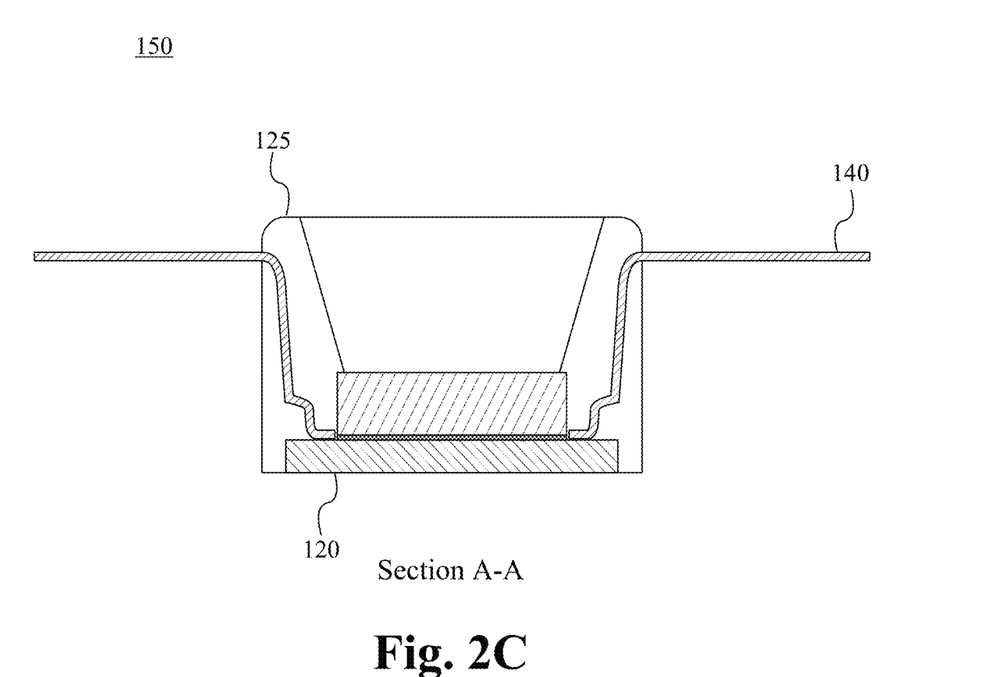
FIG. 2C is a sectional view of a solar cell module installed in a cowling according to some embodiments.

FIG. 2C is a sectional view of a mounted solar cell module 150 comprising a solar cell module 100 installed in a cowling 125 with conductors 140 soldered 145 to a contact on the solar cell module 100 according to some embodiments.

Figure 3:
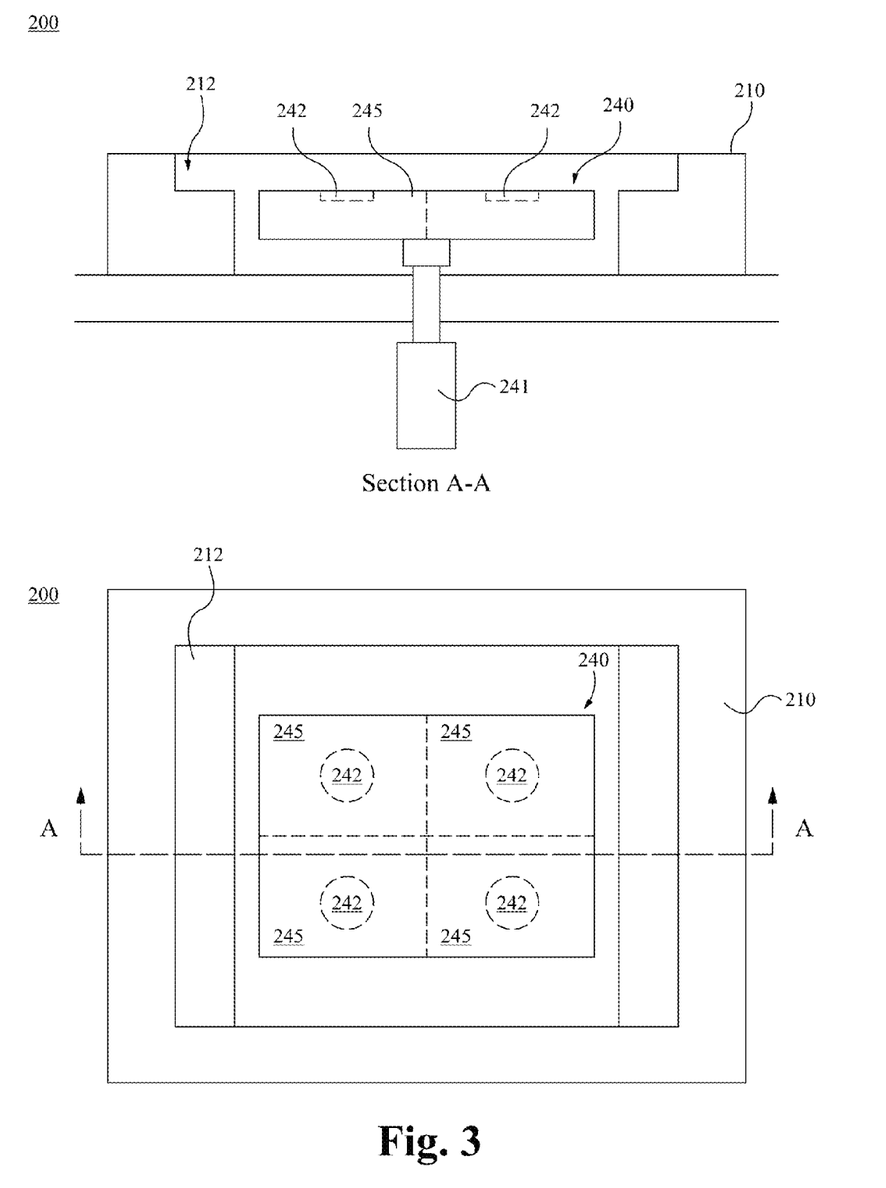
FIG. 3 illustrates a lower assembly of a vacuum reflow voiding rework system according to some embodiments.

FIG. 3 illustrates a lower assembly 200 of a vacuum reflow voiding rework system 500 according to some embodiments. The lower assembly 200 comprises a recessed area 212 of a mount 210 that receives the mounted solar cell module 150 (not shown) as described above in FIGS. 2A and 2C. The lower assembly 200 comprises a heat source 240 that is aligned with the location of a solder area 115 (not shown) of a mounted solar cell module 150 (not shown) installed in the recessed area 212 of the mount 210. The heat source 240 comprises a plurality of heat modules 245 each having a sensor 242 for reading the temperature of the associated heat module 245. In FIG. 3, a heat source 240 has four heat modules each marked 245 and having a corresponding heat sensor 242. Each heat module 245 is able to be controlled using a servo algorithm such as a proportional integral derivative gain (PID) servo algorithm or a time proportional control servo algorithm. Section A-A of FIG. 3 illustrates an actuator 241 that can be used to position the heat source 240 under the mounted solar cell module (not shown) and to retract the heating module 240 from the mounted solar cell module (not shown).

Figure 4:
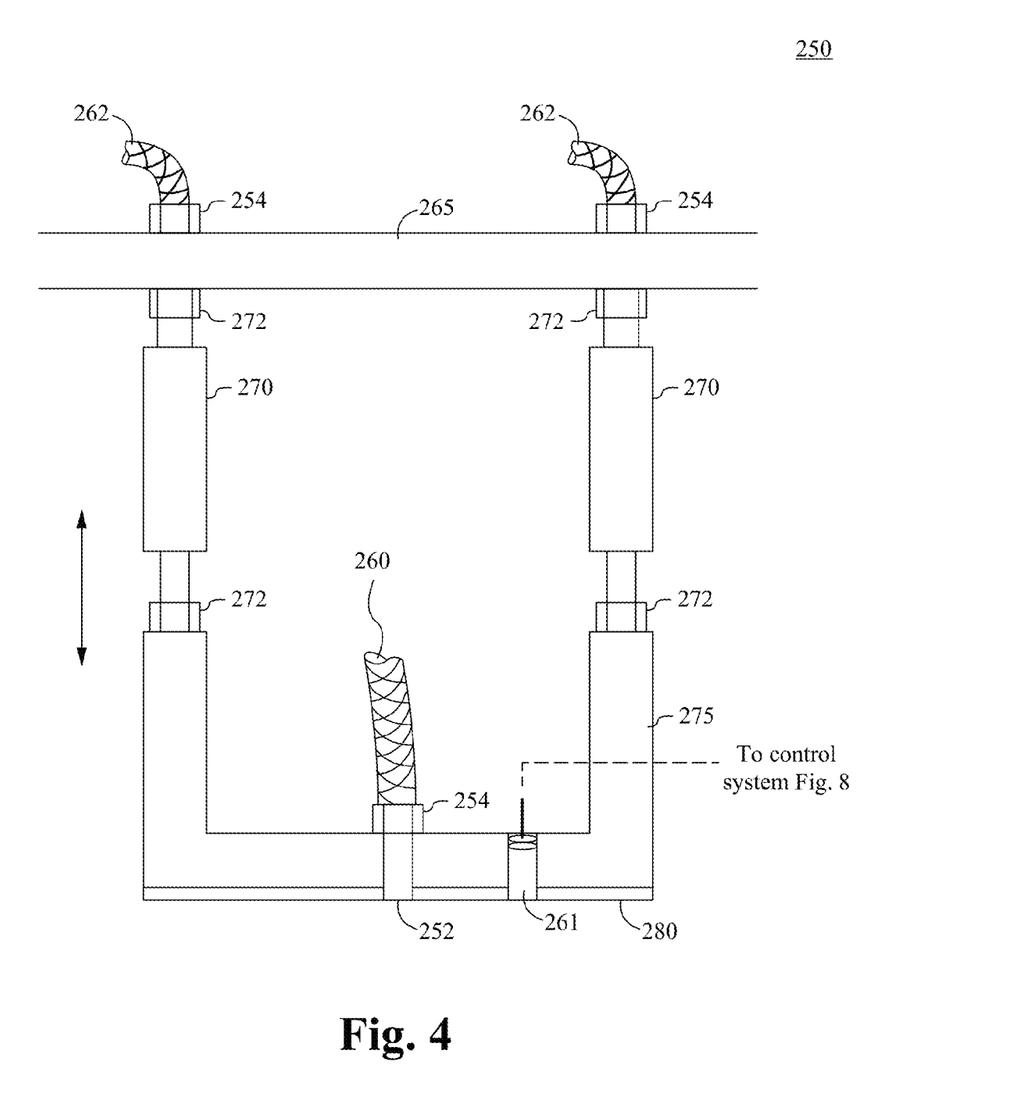
FIG. 4 illustrates an upper assembly of a vacuum reflow voiding rework system according to some embodiments according to some embodiments.
Figure 8:
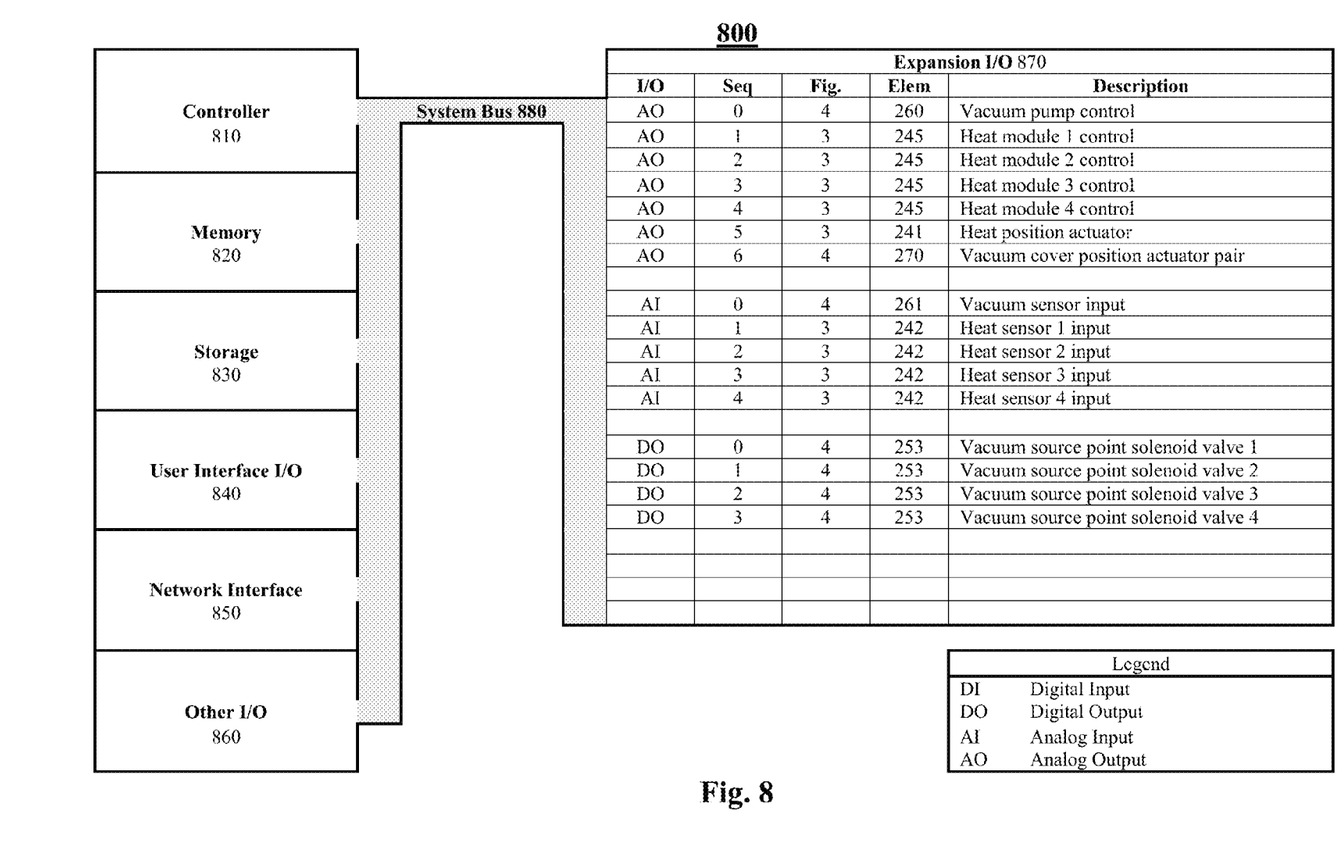
FIG. 8 illustrates a control system for automating a reworking method practiced on a reworking system according to some embodiments.

FIG. 4 illustrates an upper vacuum assembly 250 of a vacuum reflow voiding rework system 500 according to some embodiments. The upper vacuum assembly 250 comprises a retractable vacuum cover 275 coupled to actuators 270 with fasteners 272. The actuators 270 are coupled to an upper frame 265. The actuators 270 can be pneumatically operated using an air supply 262 coupled to the actuators 270 at the upper frame 265 with a threaded opening 253 and fastener 254. The retractable vacuum cover 275 comprises a vacuum source 260 coupled to the retractable vacuum cover 275 with a coupling 254 leading to a vacuum source point 252. The vacuum source point 252 draws a vacuum inside a sealed chamber formed at least in part by the cowling that houses a solar cell module described in FIGS. 2A and 2C, above. The vacuum source 260 and the actuators 270 are coupled to a controller 800, as shown in FIG. 8 below. The upper vacuum assembly 250 is sealed to a solar module cowling (not shown) when the retractable vacuum cover 275 is lowered onto the cowling (not shown) and sealed by a gasket 280, thereby forming a sealed chamber. A vacuum sensor 261 is coupled to the retractable vacuum cover 275 to sense the vacuum within the sealed chamber. The vacuum sensor 261 output is routed to the control system 800 as described in FIG. 8 below.

Figure 5:
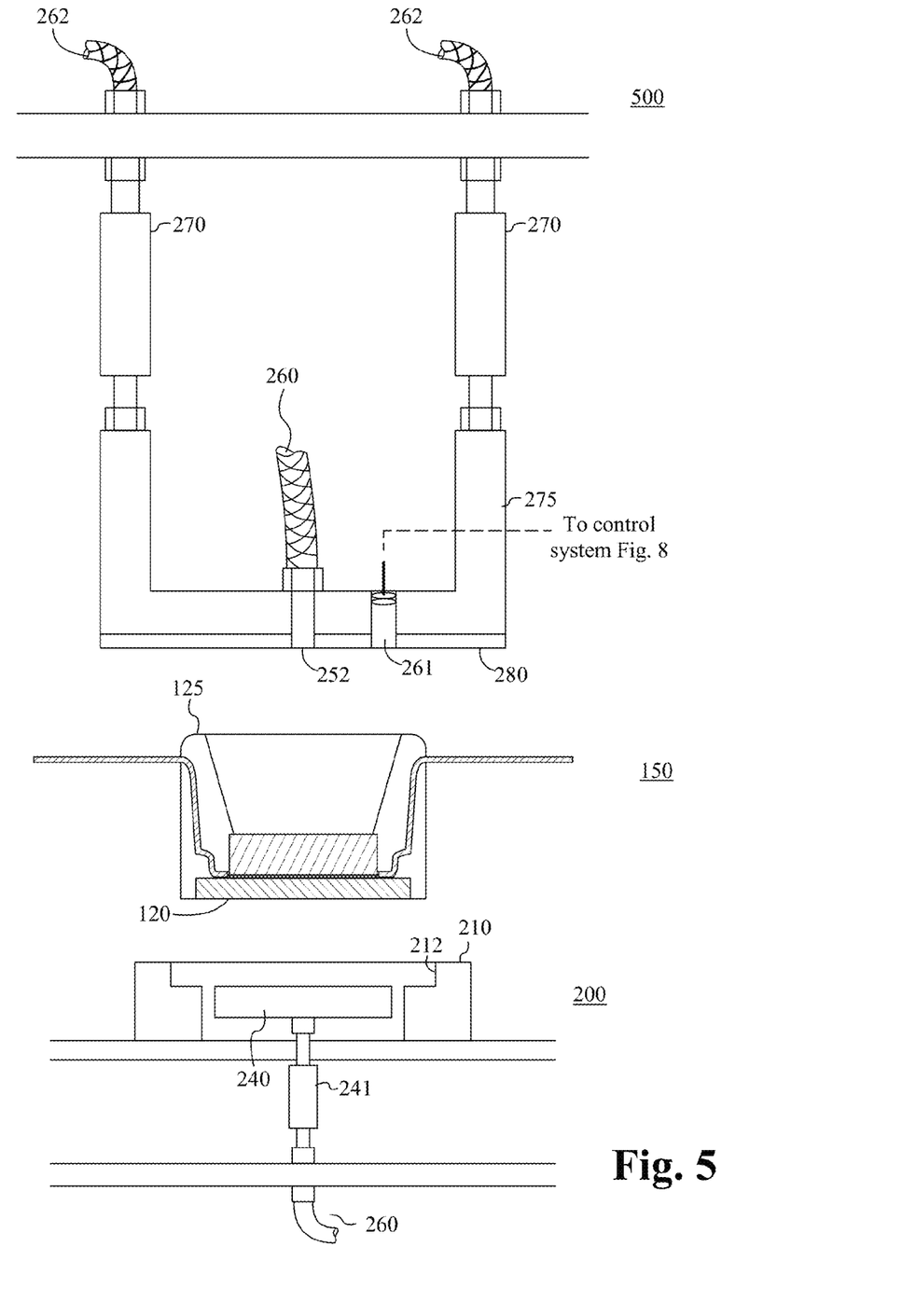
FIG. 5 illustrates a vacuum reflow voiding rework system according to some embodiments.

FIG. 5 illustrates a vacuum reflow voiding rework system 500 according to some embodiments. As shown in FIG. 3, the lower assembly 200 comprises a mount 210 with a recessed area 212 to receive a mounted solar cell module 150. The lower assembly 200 further comprises a heater module 240 that is able to be positioned under, and retracted from, the substrate 120 of the mounted solar cell module 150 by an actuator 241. The upper vacuum assembly 250 comprises an upper vacuum cover 275 that can be positioned using actuators 270. The upper vacuum cover 275 further comprises a vacuum source point 252, a vacuum sensor 261, and a gasket 280. Once the mounted solar cell module 150 is placed into the mount 210, the upper vacuum cover 275 can be lowered down to seal with the top of the cowling 125 of the mounted solar cell model 150 using the gasket 280 on the face of the upper vacuum cover 275. The application of vacuum 260 to the vacuum source point 252, monitoring of vacuum with the vacuum sensor 261, and controlling of heat to the heater module 240 is implemented by a control system 800 as shown in FIG. 8. Exemplary methods for vacuum reflow voiding rework are described in FIGS. 6 and 7

Figure 6:
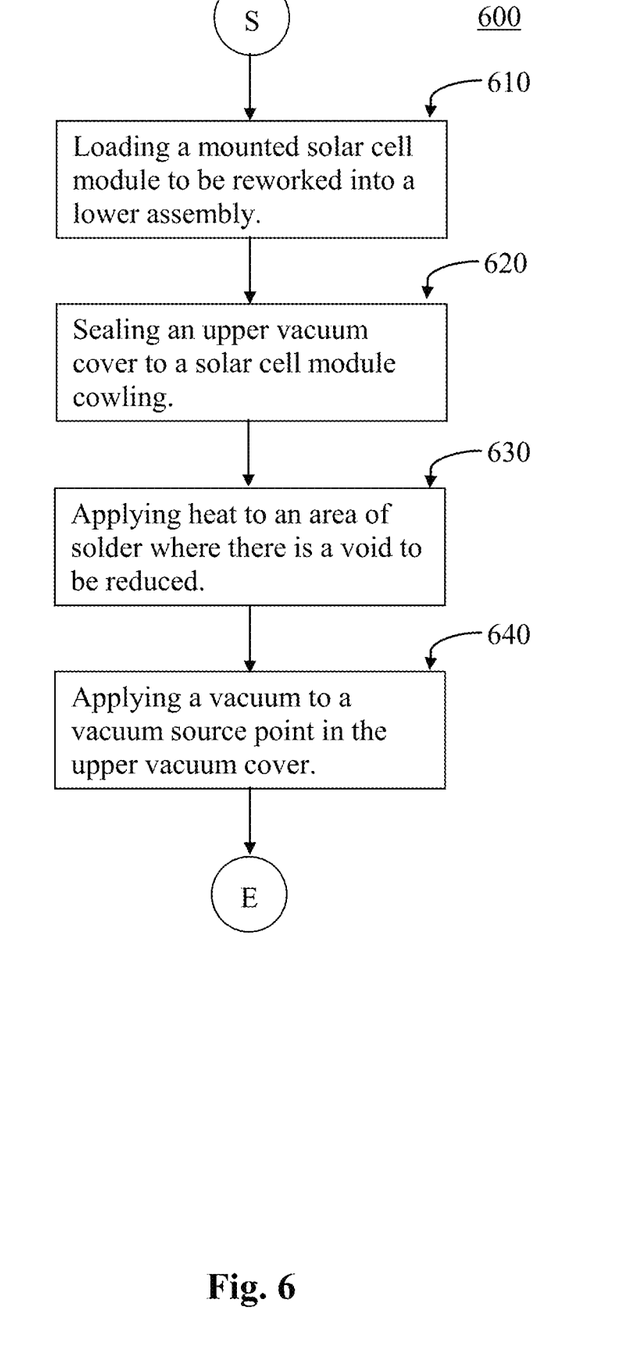
FIG. 6 illustrates a method of reworking a solar cell module having a void in the solder between a solar cell die and a substrate according to some embodiments.

FIG. 6 illustrates the steps 600 of a method of reworking a mounted solar cell module 150 having a void 110 in the solder 115 between a solar cell die (e.g., 105) and a substrate (e.g., 120) according to some embodiments. The method begins at step 610 wherein a mounted solar cell module 150 to be reworked is loaded into the lower assembly 200 that is described above in FIG. 3. At step 620, the upper vacuum cover 275 is sealed to the cowling 125 of the mounted solar cell module 150 thereby forming a sealed chamber. As is known in the art, an appropriate gasket 280 is used to ensure a good seal between the upper vacuum cover 275 and the cowling 125. At step 630, heat is applied to the solder area 115 to melt the solder so that a void 110 in the solder can be reduced in size. The heat can be applied to the solder by heating the substrate upon which the mounted solar cell module 150 is mounted. The heat is transmitted through the substrate and melts the solder. In some embodiments, a mounted solar cell module 150 has heat transfer elements built into the substrate 120 for post-rework coupling to a heat dissipation assembly such as a finned metal heat exchanger. In such assemblies, the heat from the heat source is transmitted to the solder substantially by the heat transfer elements in the substrate, rather than by the substrate material itself. At step 640, a vacuum is applied to the sealed chamber to assist in drawing out air entrapped in the melted solder due to the void in the solder. In the embodiment shown in FIG. 4, the upper vacuum cover 275 comprises a vacuum source point 252. The amount of the vacuum is chosen to help the entrapped air overcome the surface tension of the molten solder so that the void can be reduced.

Figure 7:
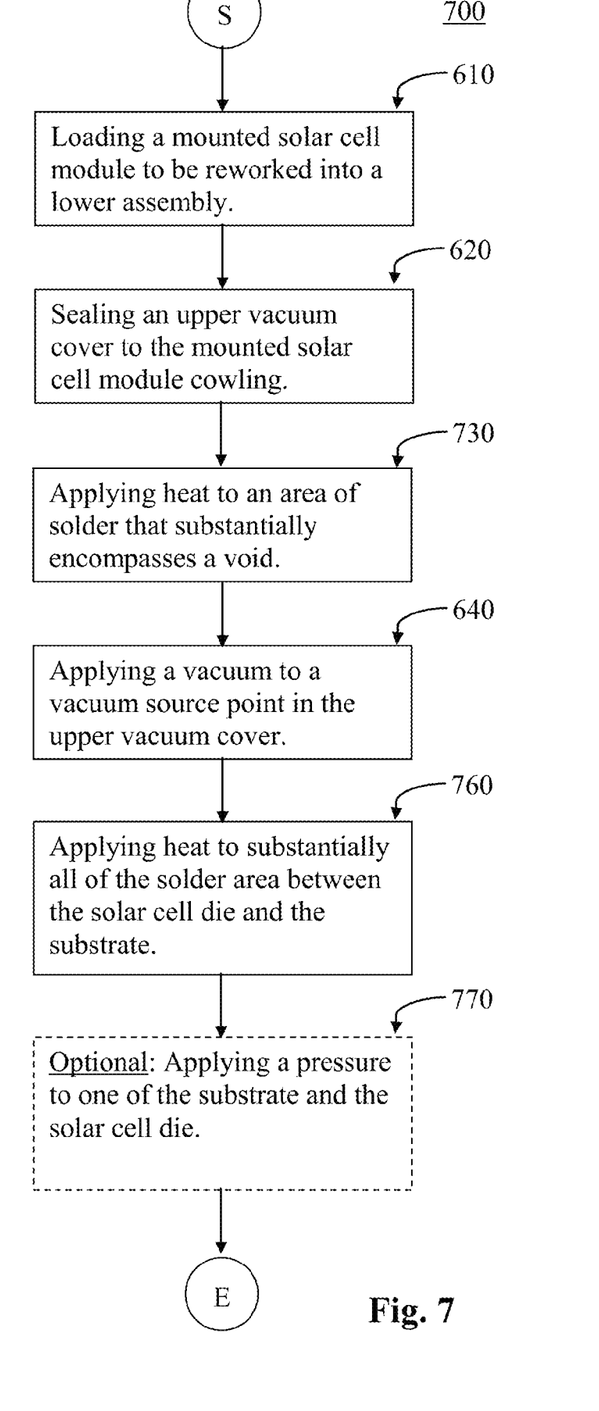
FIG. 7 illustrates a method of reworking a solar cell module having a void in the solder between a solar cell die and a substrate according to some embodiments.

FIG. 7 illustrates the steps 700 of a method of reworking a solar cell module having a void in the solder between a solar cell die and a substrate according to some embodiments. The steps 700, include the steps 610, 620, and 640 described in FIG. 6. In FIG. 7, the heat source used to apply heat to the solder region comprises a plurality of heating modules that can be controlled independently of each other. At step 730, by selecting an appropriate heating element, heat is applied to a region of the solder area that substantially encompasses a void. The solder around the void is melted so that the void can be reduced by the vacuum applied in step 640. At step 760, heat is applied to substantially all of the solder area between the solar cell die and the substrate so that the resulting reflow of solder will distribute and achieve a uniform thickness throughout the solder area. To help achieve a uniform thickness of the solder during reflow of the solder, in some embodiments pressure is applied at step 770 to at least one of the substrate and the solar cell die effectively pressing the substrate and solar cell die together.

FIG. 8 illustrates a control system 800 for automating a reworking method practiced on a reworking system according to some embodiments. The control system 800 comprises a controller 810, a memory 820, storage 830, a user interface I/O port 840, a network interface 850, other I/O 860, and an expansion I/O module 870, all communicatively coupled by a system bus 880. The controller 810 executes instructions programmed into the storage 830 and read into the memory 820. The programmed instructions carry out the method steps 600, 700, or both, for reworking a solar cell module to reduce or eliminate solder voids. Other I/O 860 can comprise interrupt lines, timer/counter inputs and outputs, communications lines such as Clocked Serial I/O, I$^2$C, USB, RS232, RS485, and other communications protocols. The expansion I/O module 870 comprises analog inputs (AI), analog outputs (AO), digital inputs (DI) and digital outputs (DO). As shown in FIG. 8, analog outputs control the vacuum pump, the heat position actuator, the upper vacuum cover position actuators, and the one or more heat modules 245. Analog inputs include a vacuum sensor 261 and the one or more heating sensors 242. In embodiments incorporating modulation of the vacuum source, the vacuum source control can be implemented as an interrupt routine from a timer/counter in the other I/O 860. A vacuum sensor 261 is coupled to an analog input to measure the vacuum inside the sealed chamber formed at least in part by the cowling 125. One skilled in the art can conceive of other control schemes exemplified by the control system shown in FIG. 8. A user interface for obtaining user inputs and for providing information to the user can be coupled to the control system via the User Interface I/O port 840.

Heating Means

Inside the lower assembly, a heat source is disposed in a manner to thermally couple to a solder area of a solar cell soldered to a substrate. The heat source is controlled, preferably, by a control system as described above, to melt all or a portion of the solder area to reduce a void in the solder by evacuating air trapped in the void and reflowing the solder. The heat source can comprise a resistance element and a current driver. The heat source is preferably controllable over a temperature range from ambient to 400° C. For solders with a lower melting point, a high-powered Peltier thermoelectric cooler can be used to both heat the solder up to about 200° C. and to cool the solder rapidly. Heating can also be achieved by pulsed or continuous wave laser. Other heat sources include heat from a heat source fluidly coupled to the sealed vacuum chamber, such as a heated atmosphere, a plasma, or flame. Further, a heating source can be thermally coupled to the sealed vacuum chamber, such as a heated atmosphere or fluid. The heat source can further comprise a heat sensor for each heat module, the heat sensor providing closed loop feedback for accurate control of the corresponding heat module. A heat module can be controlled using a servo algorithm such as a proportional, integral, derivative (PID) servo or a time proportional control servo. As described above, the heat source can be provided on an actuator that positions the heat source to be coupled to the substrate of a solar cell module. The heat source can be preheated to a predetermined temperature prior to positioning the heat source to thermally couple with the substrate. Alternatively, the heat source can be coupled to the substrate then brought to a predetermined temperature. The heating process can further comprise preheating the heat source to a first temperature prior to thermally coupling the heat source to the substrate, then heating the heat source to a second temperature after coupling the heat source to the substrate. Such process steps can be programmatically accomplished using the control system 800 described in FIG. 8. One skilled in the art will recognize other heat control algorithms that can be used in accordance with the embodiments.

Vacuum Control Means

A vacuum force can be applied to the sealed chamber formed by the substrate, cowling, and upper vacuum cover using a vacuum pump. In some embodiments it is preferable to modulate the vacuum within the chamber to aid in evacuating air entrapped in the solder void region. By modulating or pulsing the vacuum, a motive force is generated in the air in the void that aids in overcoming the surface tension of the melted solder to evacuate the void. Alternatively, a positive pressure can be momentarily injected into the sealed chamber while the vacuum force remains constant. The net result would be a modulating or pulsing of the vacuum force inside the sealed chamber.

Pressure Control Means

A pressure force can be applied to one or both of the solar cell die and the substrate. Such pressure force can be by mechanical means applied to the solar cell die, against the substrate. After a solder void has been reduced and the reflow of solder has begun, the vacuum in the vacuum chamber can be released and a pneumatic pressure can be applied to the sealed vacuum that presses the solar cell die and substrate together to promote uniform thickness of the solder during solder reflow.

Programmed Cycle Operation

A reworking operation can be performed using a pre-programmed cycle based upon variable inputs, some of which can be pre-programmed into the controller 810. Variables include the characteristics of the void(s) in the solder such as size, shape, and location within the solder area. Other variables include the solder material thickness, material composition and melting point, and the substrate material, thickness and thermal conductivity. Some of these variables will be relatively constant based upon the specifications of a particular solar cell module. An operator of a reworking system can select a particular solar cell module type with preprogrammed specifications for reworking. The operator further examines the nature of the voids in the solder and positions the mounted solar cell module into the lower assembly. Based upon the operator examination, the operator further can choose a particular vacuum pressure at the vacuum source point within the chamber. The operator can further choose whether to heat the entire solder area at once, or to heat one or more selected areas to reduce void(s) before reflowing the entire solder area. Other parameters include specifying a heat source ramp rate, cycle duration, vacuum force setting, vacuum source modulation rate and magnitude, heat source ramp down rate, cooling rate for Peltier heat sources, and cycle duration.

Actuator Means

As described above, the heater module 240 can be positioned under, and retracted from, the underside of the substrate 120 of a mounted solar cell module 150 in the lower assembly mount 210 by means of an actuator 241. As also described above, the upper vacuum cover 275 can be positioned onto, and retracted from, the cowling 125 of a mounted solar cell module 150 by means of actuators 270. In FIGS. 3-5, the actuators 241 and 270 are shown as pneumatic actuators, driven by air sources 260 and 262. One skilled in the art will recognize that the actuators could alternatively be hydraulically operated, electrically operated, or manually operated.

The present invention has been described in terms of specific embodiments incorporating details to facilitate the understanding of principles of construction and operation of the invention. Such reference herein to specific embodiments and details thereof is not intended to limit the scope of the invention. It will be readily apparent to one skilled in the art that other various modifications are able to be made to the embodiments chosen for illustration without departing from the spirit and scope of the invention as defined by the appended claims.

What is claimed is:

1. A method of reducing solder voids in a module, wherein the module comprises a substrate and a component soldered to the substrate, and wherein the module is mounted in a solar cell die housing, wherein an opening is formed at a top of the solar cell die housing when the module mounted is in the solar cell die housing, the method comprising:
positing the solar cell die housing in a recessed area of a mount such that the module is above a heat source;
lowering a vacuum cover down onto the solar cell die housing, thereby forming a sealed chamber from the solar cell die housing, the vacuum cover, and the substrate, and wherein when the vacuum cover is lowered down onto the solar cell die housing with the module mounted therein, a bottom surface of the vacuum cover that interfaces with the solar cell die housing extends beyond the perimeter of the opening;
extending the heat source from within the mount towards the module without extending the mount;
transmitting heat from the heat source;
heating the solder to a predetermined temperature; and
applying a vacuum to the sealed chamber.

2. The method of claim 1, wherein the predetermined temperature is a melting point of the solder.

3. The method of claim 1, wherein the heat source is heated to a temperature before coupling the heat source to the substrate.

4. The method of claim 1, wherein heating the solder comprises heating an area of the solder that substantially encompasses a void in the solder.

5. The method of claim 4, further comprising heating substantially all of the solder.

6. The method of claim 5, wherein heating substantially all of the solder is performed after applying the vacuum to the sealed chamber.

7. The method of claim 1, wherein the vacuum is modulated.

8. The method of claim 1, further comprising applying a pressure to one of the component and the substrate such that solder is under a compressive force.

9. The method of claim 1, wherein the solar cell die housing is positioned above the heat source.

10. The method of claim 1, wherein the solar cell die housing is removably positioned between the heat source and the vacuum cover.

11. The method of claim 1, wherein when the vacuum cover is lowered down onto the solar cell die housing, the vacuum cover provides a seal to the chamber at a top of the solar cell die housing.

12. The method of claim 1, wherein the module is a mounted solar cell module.

13. The method of claim 1, further comprising retracting away inside the mount and below the recessed area the heat source from the sealed chamber.

14. The method of claim 1, wherein the heat source comprises a plurality of heat modules, and further comprising individually controlling each of the plurality of heat modules.

15. A method of reducing solder voids in a mounted module comprising a component soldered to a substrate that is mounted in a solar cell die housing, wherein an opening is formed at a top of the solar cell die housing when the module mounted is in the solar cell die housing, wherein a portion of the substrate is exposed at a bottom of the solar cell die housing, the method comprising:
loading the mounted module into a recessed area of a lower assembly, wherein the lower assembly includes a heat source;
lowering an upper vacuum cover onto the solar cell die housing, thereby forming a sealed chamber from the upper vacuum cover, the solar cell die housing and the substrate, wherein when the upper vacuum cover is lowered down onto the solar cell die housing with the module mounted therein, a bottom surface of the upper vacuum cover that interfaces with the solar cell die housing extends beyond the perimeter of the opening;
extending the heat source from within the lower assembly towards the recessed area of the lower assembly without extending the mount;
applying heat to the substrate, thereby melting solder thereon; and
drawing out air entrapped in the melted solder.

16. The method of claim 15, further comprising choosing an amount of vacuum to help the entrapped air overcome a surface tension of the melted solder to reduce the solder voids.

17. The method of claim 1, wherein the vacuum cover includes the vacuum source coupled with the vacuum cover leading to a vacuum source point, wherein the vacuum source point is configured to draw the vacuum inside the sealed chamber.

18. The method of claim 1, further comprising sensing the vacuum within the sealed chamber via a vacuum sensor that is coupled to the vacuum cover.

* * * * *